United States Patent
Asai et al.

(10) Patent No.: US 7,564,221 B2
(45) Date of Patent: Jul. 21, 2009

(54) DEVICE AND METHOD FOR ESTIMATING THE INPUTTABLE/OUTPUTTABLE POWER OF A SECONDARY BATTERY

(75) Inventors: Hisafumi Asai, Yokohama (JP); Hideaki Yonezawa, Yokohama (JP); Hideo Nakamura, Yokohama (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 248 days.

(21) Appl. No.: 11/605,597

(22) Filed: Nov. 28, 2006

(65) Prior Publication Data

US 2007/0145953 A1    Jun. 28, 2007

(30) Foreign Application Priority Data

Nov. 29, 2005    (JP) ............................. 2005-343476

(51) Int. Cl.
  *H01M 10/46* (2006.01)
(52) U.S. Cl. ..................................... 320/132
(58) Field of Classification Search ............... 320/107, 320/132, 134, 136, 149; 324/426, 427, 430, 324/433
See application file for complete search history.

(56) References Cited

U.S. PATENT DOCUMENTS

| 5,561,362 | A * | 10/1996 | Kawamura et al. ........ 320/134 |
| 7,009,402 | B2 | 3/2006 | Yumoto et al. |
| 7,098,625 | B2 | 8/2006 | Yumoto et al. |
| 2005/0035742 | A1 | 2/2005 | Koo et al. |

FOREIGN PATENT DOCUMENTS

| JP | 2000-002758 A | 1/2000 |
| JP | 2004-178848 | 6/2004 |
| JP | 2004-264126 | 9/2004 |
| JP | 2005-189028 | 7/2005 |
| JP | 2006-023286 | 1/2006 |

* cited by examiner

*Primary Examiner*—Edward Tso
(74) *Attorney, Agent, or Firm*—Young Basile

(57) ABSTRACT

An inputtable/outputtable power estimating device and method that can correctly estimate maximum inputtable and/or outputtable power of a secondary battery that can continue for a prescribed period of time. When the secondary battery is continuously charged or discharged for a prescribed period of time, the estimated value of a maximum possible charge and/or discharge current is estimated such that the terminal voltage of the secondary battery reaches a predetermined upper limit voltage or lower limit voltage. The inputtable and/or outputtable power is estimated as the power that can be used to charge the secondary battery or be discharged from it on the basis of the estimated maximum possible current(s) and the respective upper limit voltage or lower limit voltage.

20 Claims, 9 Drawing Sheets

DEVICE AND METHOD FOR ESTIMATING THE INPUTTABLE/OUTPUTTABLE POWER OF A SECONDARY BATTERY

CROSS-REFERENCES TO RELATED APPLICATIONS

This application claims priority from Japanese Patent Application Serial No. 2005-343476, filed on Nov. 29, 2005, which is incorporated herein in its entirety by reference.

TECHNICAL FIELD

The invention pertains in general to a technology for estimating the maximum power that can be input to or output from a secondary battery.

BACKGROUND

Japanese Kokai Patent Application No. 2004-264126 discloses a conventional device for estimating the inputtable/outputtable power of a battery. In that device, the output current I and terminal voltage V of the secondary battery are detected. The current I and terminal voltage V are input to an adaptive digital filter using the battery model to estimate the parameters used in the mathematical formula of the battery model. The estimated parameters and current I and terminal voltage V are used to calculate open-circuit $V_0$. The inputtable/outputtable power (i.e., possible charge/discharge power) estimating device estimates the inputtable power (possible charge power) of the secondary battery on the basis of the estimated parameters, open-circuit voltage $V_0$ and upper limit voltage $V_{MAX}$ and estimates the outputtable power (possible discharge power) of the secondary power on the basis of the estimated parameters, open-circuit voltage $V_0$ and lower limit voltage $V_{MIN}$.

BRIEF SUMMARY OF THE INVENTION

According to one embodiment of a power estimating device for estimating a power associated with a secondary battery herein, the device comprises a controller. The controller includes a maximum possible current estimating part operable to estimate a maximum possible current through the secondary battery when the terminal voltage of the secondary battery reaches one of an upper limit voltage when the secondary battery is charged continuously for a first period of time and a lower limit voltage when the secondary battery is discharged continuously for a second period of time. The controller also includes a power estimating part operable to estimate the power based on the maximum possible current and the one of the upper limit voltage and the lower limit voltage. The power is at least one of an inputtable power to charge the battery and an outputtable power discharged from the battery.

According to another embodiment of a power estimating device that estimates at least one of a inputtable and a outputtable power of a secondary battery taught herein, the devices comprises current estimating means for estimating at least one of a maximum possible charge current when a terminal voltage of the secondary battery reaches an upper limit voltage when the secondary battery is continuously charged for a first period of time, and a maximum possible discharge current when the terminal voltage of the secondary battery reaches a lower limit voltage when the secondary battery is continuously discharged for a second period of time. This example of the device also includes power estimating means for estimating at least one of the inputtable power based on the maximum possible charge current, and the upper limit voltage and the outputtable power based on the maximum possible discharge current and the lower limit voltage.

Power estimating methods for estimating a power of a secondary battery where the power represents at least one of a charge power and a discharge power of a secondary battery are also taught herein. One example of such a method comprises estimating a maximum possible current when a terminal voltage of the secondary battery reaches an upper limit voltage when the secondary battery is continuously charged for a first period of time, or a lower limit voltage when the secondary battery is continuously discharged for a second period of time, wherein the maximum possible current is one of a maximum possible charging current and a maximum possible discharging current; and estimating the charge power based on the maximum possible charging current and the upper limit voltage, or the discharge power based on the maximum possible discharging current and the lower limit voltage.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

The inputtable/outputtable power of a secondary battery estimated by the conventional technology described above is the maximum estimated inputtable/outputtable power that does not go outside the range bounded by upper limit voltage $V_{MAX}$ and lower limit voltage $V_{MIN}$ during instantaneous charging or discharging. In other words, since the change in the state of the battery after the battery is continuously charged/discharged for a prescribed period of time is not taken into consideration, the estimated inputtable/outputtable power is the instantaneous power instead of the power that can continue for a prescribed period of time. However, the maximum possible charge/discharge power that can continue for a prescribed period of time might be needed in the case of using the inputtable/outputtable power. For example, if the maximum charging or discharging power that does not exceed the upper or lower limit voltage during instantaneous charging or discharging is used to estimate the maximum inputtable/outputtable power, and the device driven by the power of the secondary battery is operated at maximum power on the basis of this estimated maximum inputtable/outputtable power, the voltage will drop instantaneously and reach the predetermined lower limit voltage (for example, the voltage immediately before the battery is over-discharged). The outputtable power will then be reduced corresponding to the variation in the state of the battery (internal resistance and open-circuit voltage, that is, charging percentage (SOC: state of charge)). The acceleration drops significantly, thereby limiting the operation of the device.

Embodiments of the invention, in contrast, provide an inputtable/outputtable power estimating device, which can correctly estimate the maximum possible charge/discharge power (the inputtable/outputtable power) that can continue for a prescribed period of time even if the internal resistance or open-circuit voltage changes due to charging or discharging of the secondary battery. As described herein, since the maximum power that can be maintained for output for a prescribed period of time (the outputtable power) can be estimated, when the operation of a device is carried out at the maximum power based on this data, it is possible to maintain a constant output power at least for the assumed prescribed period of time. As a result, the limitation on the operation of the device can be avoided. Similarly, for the inputtable power, a constant input power can be maintained for at least the assumed prescribed period of time. Thus, the battery can be charged efficiently without frequently upsetting the balance between charging and discharging.

Details of embodiments of the invention are described with reference to the figures.

Figure 1:
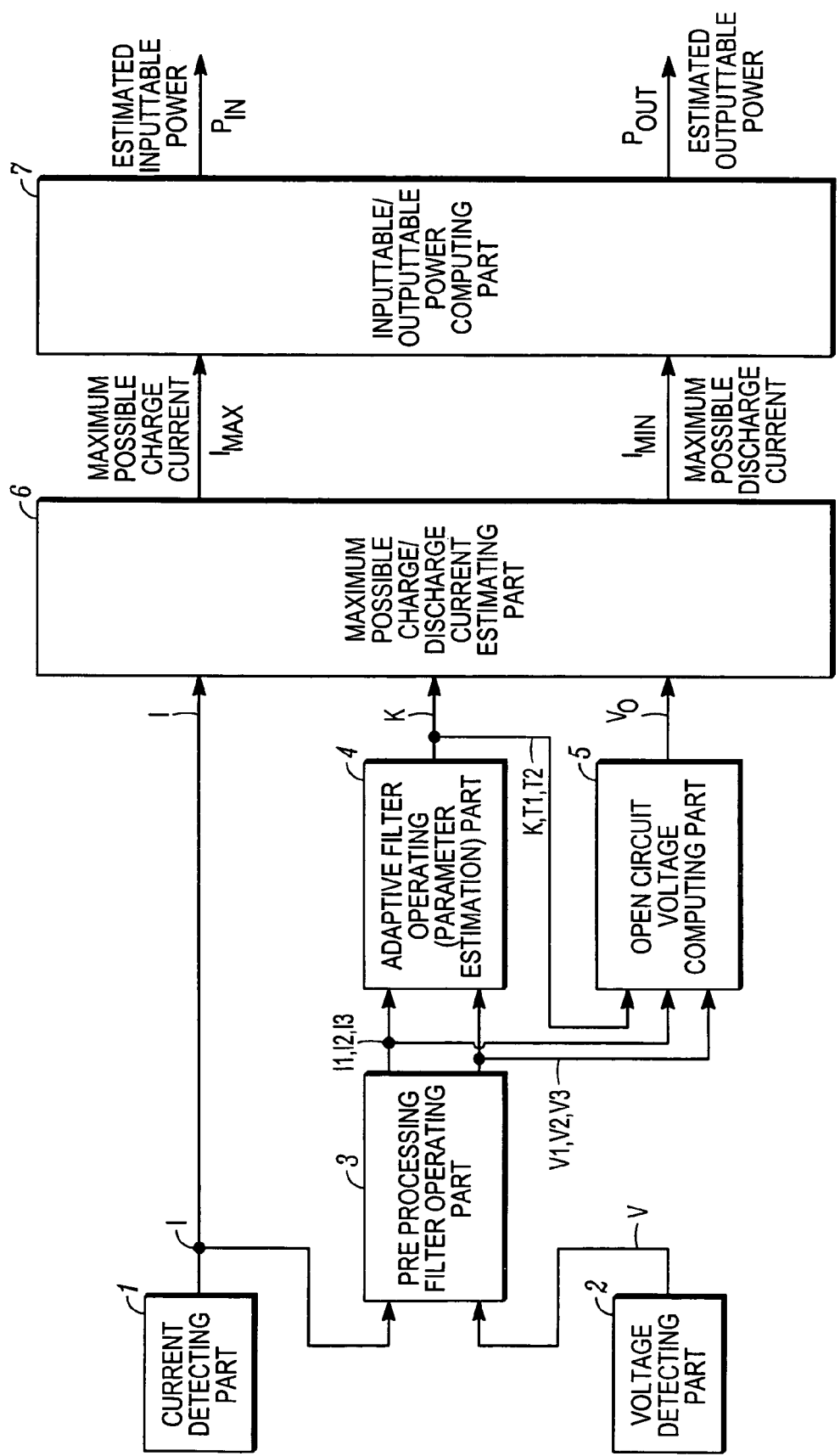
FIG. 1 is a functional block diagram illustrating an application example of the invention.

FIG. 1 is a functional block diagram of an inputtable/outputtable power estimating device disclosed herein. The device shown in FIG. 1 comprises current detecting part 1 that periodically detects the charge or discharge current (I) of a secondary battery and voltage detecting part 2 that periodically detects the terminal voltage (V) of the secondary battery. Pre-processing filter operating part 3 of the device computes the values $(I_1, V_1)$ obtained by processing the measured current I and voltage V with a low-pass filter, approximate first-order differential values $(I_2, V_2)$ and approximate second-order differential value $(I_3, V_3)$. An adaptive digital filter operating part (parameter estimating means) 4 of the device can (simultaneously) estimate the parameters $(K, T_1, T_2)$ indicating the internal state of the battery by using an adaptive digital filter operation based on the output value of pre-processing filter operating means 3. Open-circuit voltage computing part 5 computes open-circuit voltage $V_0$ from the output of pre-processing filter operating part 3 and the estimated battery parameters estimated by adaptive digital filter operating part 4. Maximum possible charge/discharge current estimating part 6 estimates the maximum possible charge/discharge current after charging or discharging for a predetermined prescribed period $T_c$ from current I detected by current detecting part 1, internal resistance K as one of the parameters indicating the internal state of the battery estimated by adaptive digital filter operating part 4, and estimated open-circuit voltage $V_0$ computed by open-circuit voltage computing means 5. Finally, inputtable/outputtable power computing part 7 computes the estimated inputtable/outputtable power from the maximum possible charge/discharge current.

Figure 8:
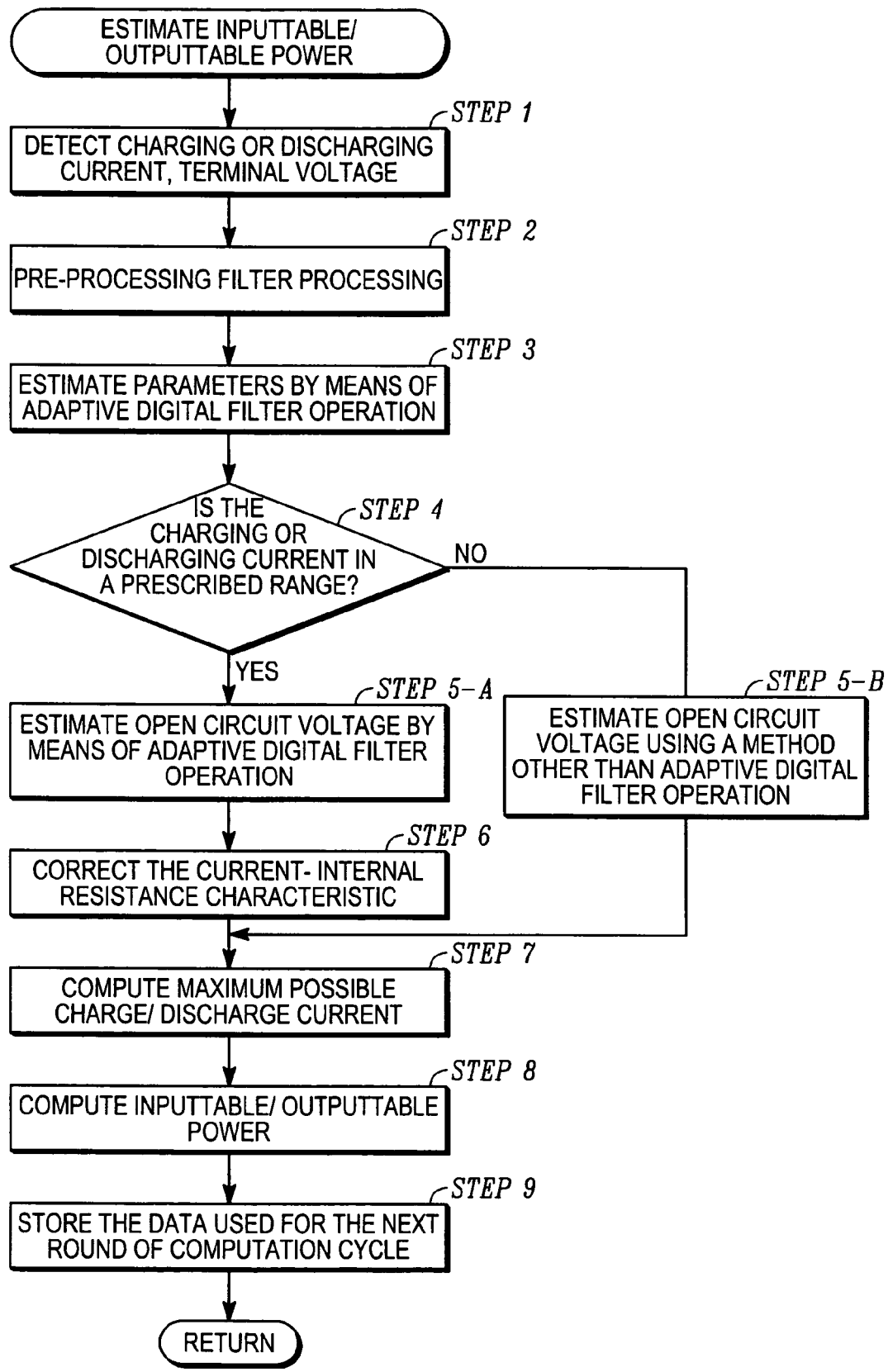
FIG. 8 is a flow chart of the inputtable/outputtable power estimation operation.

As will be explained in step 5-B in FIG. 8, if the charging or discharging current is outside a prescribed range, since the estimated open-circuit voltage $\hat{V}_0$ computed using the value estimated by the adaptive digital filter operation is unreliable, open-circuit voltage computing part 5 computes the estimated open-circuit voltage using another method that does not use the adaptive digital filter operation (such as a method using current integration).

Also, in this example maximum possible charge/discharge current estimating part 6 estimates both the maximum possible charge current and the maximum possible discharge current. Similarly, inputtable/outputtable power computing part 7 computes both inputtable power $P_{in}$ and outputtable power $P_{out}$. However, it is also possible to estimate and compute only one of the two values in each part if desired.

The maximum possible charge current is the charging current immediately before the battery reaches the prescribed upper limit voltage (for example, the voltage immediately before reaching the overcharged state). The maximum possible discharge current is the discharge current immediately before the battery reaches the prescribed lower limit voltage (for example, the voltage immediately before reaching the over-discharged state), which is below the upper limit voltage. These currents are generally known as the maximum possible charge/discharge current. Similarly, the inputtable power is the chargeable power before the battery reaches the prescribed upper limit voltage, and the outputtable power is the dischargeable power before the battery reaches the prescribed lower limit voltage. These powers are generally known as the inputtable/outputtable power.

Figure 2:
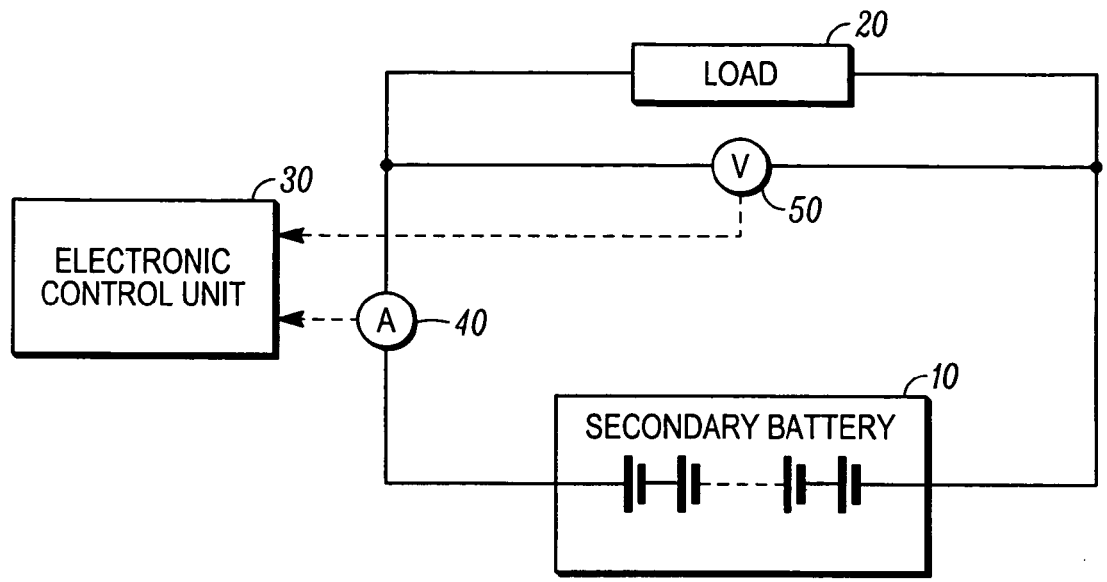
FIG. 2 is a block diagram illustrating the detailed configuration of the example of FIG. 1.

FIG. 2 is a block diagram of an application example. This example applies the inputtable/outputtable power estimating device for a secondary battery to a system that drives a motor or other load with a secondary battery (referred to as battery hereinafter) and charges the secondary battery with the power generated by an alternator that generates power when the alternator is driven to rotate by a motor or engine used as a power source.

More specifically, FIG. 2 shows a secondary battery 10, a load, such as a motor of an electric vehicle, 10 and an electronic control unit 30 that estimates the internal condition, such as the inputtable/outputtable power, of the secondary battery 10. The electronic control unit 30 comprises an electronic circuit and a microcomputer, which includes a central processing unit (CPU) that runs a program and memory (a ROM or RAM or both) used for storing programs and operation results. The processing parts (e.g., programming instructions) described hereinafter are generally stored in memory, and the functions of each of the parts is performed by the logic of the CPU. In addition to the possibility of the electronic control unit 30 being a dedicated microcontroller, the functions performed by this controller could also be performed by a standard engine microcontroller that includes a CPU, random access memory, read only memory and input/output ports receiving input signals and sending the output signals as discussed in more detail below, or could be a microprocessor using external memory.

FIG. 2 also shows a current sensor (e.g., an ammeter) 40 that detects the charging or discharging current (referred to as "current" hereinafter) with respect to secondary battery 10. A voltage sensor (e.g., a voltmeter) 50 detects the terminal voltage of the battery (referred to as "voltage" hereinafter). Both the current sensor 40 and the voltage sensor 50 are connected to electronic control unit 30.

As shown in FIG. 1, electronic control unit 30 is equipped with pre-processing filter operating part 3, adaptive digital filter operating part 4, open-circuit voltage computing part 5, maximum possible charge/discharge current estimating part 6 and inputtable/outputtable power computing part 7. Also, current sensor 40 is equivalent to current detecting part 1, and voltage sensor 50 is equivalent to voltage detecting part 2.

First, the method of estimating the battery parameters (K, $T_1$, $T_2$) using the adaptive digital filter operation performed by adaptive digital filter operating part 4 shown in FIG. 1 is explained.

Figure 3:
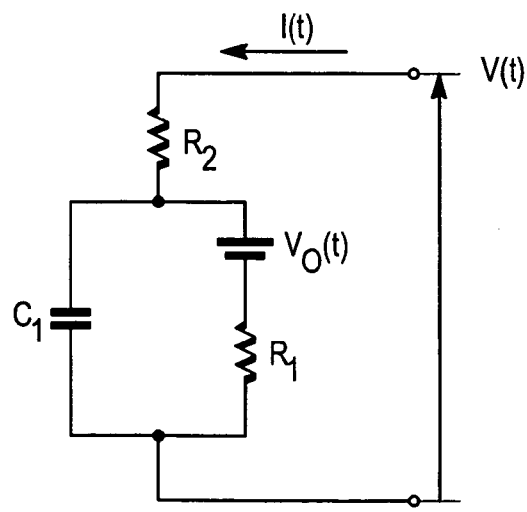
FIG. 3 is an equivalent circuit model of the secondary battery used in this example.

FIG. 3 is an equivalent circuit model of the secondary battery 10. The equivalent circuit model is a reduced (primary) model that does not specifically separate the positive and the negative electrodes. However, it can display the charging or discharging characteristics of the actual battery relatively accurately. In FIG. 3, the model input is current I (in Amperes where a positive value indicates charging and a negative value indicates discharging). The model output is terminal voltage V (in volts). The resistor $R_1$ (in Ohms) is the charge transfer resistance, and resistor $R_2$ (in Ohms) is the pure resistance. Capacitor $C_1$ is the capacitance of the double electric layer, and voltage $V_0$ (in volts) is the open-circuit voltage (also called electromotive force or open voltage).

The general formula of the battery model is expressed by formula (1) below:

$$V = \frac{B(s)}{A(s)} \cdot I + \frac{1}{C(s)} \cdot V_0 \quad (1)$$

wherein $$A(s) = \sum_{k=0}^{n} a_k \cdot s^k;$$

$$B(s) = \sum_{k=0}^{n} b_k \cdot s^k;$$

$$C(s) = \sum_{k=0}^{n} c_k \cdot s^k;$$

s denotes a LaPlace transform operator;
A(s), B(s) and C(s) denote each polynomial of s (n denotes degrees); and
$a_1 \neq 0$, $b_1 \neq 0$ and $c_1 \neq 0$.

In a battery whose open-circuit voltage converges relatively quickly, such as a lithium ion battery, the denominators of the first and second terms on the right side of formula (1) can be represented by the same time constant $T_1$. The primary model in the case when the denominators of the first and second terms on the right side of formula (1) are both assumed to be A(s) is expressed by the following formulas (2)-(4). In the following application example, the denominators of the first and second terms on the right side are represented by the same time constant $T_1$, and it is described as A(s)=C(s) in formula (1). In order to simplify the explanation, the case of using a battery that converges relatively quickly, such as a lithium ion battery, is explained in the example. However, this is not the only choice. Time constant A(s) can also be different from time constant C(s).

$$V(t) = \frac{C_1 \cdot R_1 \cdot R_2 \cdot s + R_1 + R_2}{C_1 \cdot R_1 \cdot s + 1} \cdot I(t) + \frac{1}{C_1 \cdot R_1 \cdot s + 1} \cdot V_0(t) \quad (2)$$

If formula (2) is converted on the basis of the equations below (collectively, formula (3)), one can obtain formula (4).

$$T_1 = C_1 \cdot R_1 \quad (3)$$
$$T_2 = \frac{C_1 \cdot R_1 \cdot R_2}{R_1 + R_2}$$
$$K = R_1 + R_2$$

$$V(t) = \frac{K \cdot (T_2 \cdot s + 1)}{T_1 \cdot s + 1} \cdot I(t) + \frac{1}{T_1 \cdot s + 1} \cdot V_0(t) \quad (4)$$

If open-circuit voltage $V_0(t)$ is calculated by integrating from the initial state obtained by multiplying variable efficiency h by current I(t), it can be expressed by formula (5).

$$V_0(t) = \frac{h}{s} \cdot I(t) \quad (5)$$

If formula (5) is substituted into formula (4), one can obtain formula (6), which can be rearranged to obtain formula (7).

$$V(t) = \frac{K \cdot (T_2 \cdot s + 1)}{T_1 \cdot s + 1} \cdot I(t) + \frac{1}{T_1 \cdot s + 1} \cdot \frac{h}{s} \cdot I(t) \quad (6)$$

$$V(t) = \frac{K \cdot T_2 \cdot s^2 + K \cdot s + h}{T_1 \cdot s^2 + s} \cdot I(t) \quad (7)$$

If a Gaussian low-pass filter $G_{LPF}(s)$ is multiplied on both sides of formula (7), one can obtain formula (8).

$$G_{LPF}(s) \cdot (T_1 \cdot s^2 + s) \cdot V(t) = G_{LPF}(s) \cdot (K \cdot T_2 \cdot s^2 + K \cdot s + h) \cdot I(t) \quad (8)$$

Here, the value obtained by processing the current I(t) detected by current detecting part 1 or the terminal voltage V(t) detected by voltage detecting part 2 with a low-pass filter or a band-pass filter is defined as shown in formula (9). This is computed in pre-processing filter operating part 3.

$$\left. \begin{array}{ll} I_1(t) = G_{LPF}(s) \cdot I(t) & V_1(t) = G_{LPF}(s) \cdot V(t) \\ I_2(t) = s \cdot G_{LPF}(s) \cdot I(t) & V_2(t) = s \cdot G_{LPF}(s) \cdot V(t) \\ I_3(t) = s^2 \cdot G_{LPF}(s) \cdot I(t) & V_3(t) = s^2 \cdot G_{LPF}(s) \cdot V(t) \end{array} \right\} \quad (9)$$

In this application example, formula (10) shows the characteristics of a Gaussian low-pass filter. However, the characteristics of the low-pass filter used herein are not limited thereby. The variable p is the time constant of the filter.

$$G_{LPF}(s) = \frac{1}{(p \cdot s + 1)^3} \quad (10)$$

Also, in pre-processing filter operating part 3, the computation can be actually carried out using a recurrence formula obtained by discretizing formula (9) and formula (10) by means of a Tustin approximation.

If formula (9) is used to rewrite formula (8) rearranged with respect to $V_2(t)$, one can obtain formula (11).

$$V_2(t) = -T_3 \cdot V_3(t) + K \cdot T_2 \cdot I_3(t) + K \cdot I_2(t) + h \cdot I_1(t) \quad (11)$$

$$= [V_3(t) \; I_3(t) \; I_2(t) \; I_1(t)] \cdot \begin{bmatrix} -T_1 \\ K \cdot T_2 \\ K \\ h \end{bmatrix}$$

Since formula (11) becomes a sum of products formula of measurable values (namely, $I_1(t), I_2(t), I_3(t), V_2(t), V_3(t)$) and unknown parameters ($T_1, T_2, K, h$), it is consistent with the standard formula (12) of the general adaptive digital filter:

$$y = \omega^T \cdot \theta \quad (12)$$

wherein
$y = V_2$;
$\omega^T = [V_3, I_3, I_2, I_1]$; and
$\theta = [-T_1, K \cdot T_2, K, h]$.

Consequently, when the signals obtained by pre-filter processing of the current I(t) detected by current detecting part 1 and the terminal voltage V(t) detected by voltage detecting part 2 are used in the adaptive digital filter computation, parameter vector $\theta$ comprising internal resistance K representing the internal state of the battery, time constants $T_1, T_2$, and parameter h can be estimated at the same time.

In this example, the "two-limit trace gain method" is used, which alleviates the logic disadvantage of the "adaptive filter realized by the method of least squares" (that is, once the estimated value converges, a correct estimate cannot be obtained again even if the parameters are changed). The algorithm used for estimating the unknown parameter vector by using the adaptive digital filter based on formula (12) becomes formula (13). The estimated value of the battery parameter at time point k is $\hat{\theta}(k)$.

$$\begin{aligned}
\hat{\theta}(k) &= \hat{\theta}(k-1) - \gamma(k) \cdot P(k-1) \cdot \omega(k) \cdot e(k) \\
e(k) &= \omega^T(k) \cdot \hat{\theta}(k-1) - y(k) \\
\gamma(k) &= \frac{\lambda_3}{1 + \lambda_3 \cdot \omega^T(k) \cdot P(k-1) \cdot \omega(k)} \\
P(k) &= \frac{1}{\lambda_1(k)} \left\{ \begin{array}{l} P(k-1) - \gamma(k) \cdot P(k-1) \cdot \\ \omega(k) \cdot \omega^T(k) \cdot P(k-1) \end{array} \right\} \\
&= \frac{Q(k)}{\lambda_1(k)} \\
\lambda_1(k) &= \begin{cases} \frac{trace\{Q(k)\}}{\gamma_U} & \text{if } \lambda_1 \leq \frac{trace\{Q(k)\}}{\gamma_U} \\ \lambda_1 & \text{if } \frac{trace\{Q(k)\}}{\gamma_U} < \lambda_1 < \frac{trace\{Q(k)\}}{\gamma_U} \\ \frac{trace\{Q(k)\}}{\gamma_L} & \text{if } \frac{trace\{Q(k)\}}{\gamma_U} \leq \lambda_1 \end{cases}
\end{aligned} \quad (13)$$

In formula (13), trace$\{Q(k)\}$ means the trace (sum of the diagonal elements) of the matrix. Also, $\lambda_1, \lambda_3, \gamma_U$ and $\gamma_L$ are design parameters where $0 < \lambda_1 < 1$ and $0 < \lambda_3 < \infty$. The number $\lambda_3$ is a constant (adjustment gain) that sets the estimation rate of the parameter estimation performed by the adaptive digital filter operation. The estimation rate can be increased by increasing the value of $\lambda_3$. However, the estimation rate is vulnerable to the influence of noise. The parameters $\gamma_U$ and $\gamma_L$ specify the upper and lower limits of the trace of matrix Q(k). They are set as $0 < \gamma_L < \gamma_U$. Also, P(0) has a sufficiently large value as the initial value, while $\hat{\theta}(0)$ has a sufficiently small non-zero value as the initial value.

The battery parameter estimating method using the adaptive digital filter operation performed in adaptive digital filter operating part 4 is described above. In the following, the method of estimating the open-circuit voltage in open-circuit voltage computing part 5 shown in FIG. 1 is explained.

First, formula (4) is rearranged to obtain the open-circuit voltage as formula (14).

$$V_0 = (T_1 \cdot s + 1) \cdot V - K(T_2 \cdot s + 1) \cdot I \quad (14)$$

The variation in open-circuit voltage $V_0$ is considered stable, and the formula obtained by multiplying both sides of the formula by low-pass filter $G_{LPF}(s)$ is used to estimate open-circuit voltage $V_0$. This value is estimated using resulting formula (15) where "^" represents an estimated value.

$$\hat{V}_0 = G_{LPF}(s) \cdot V_0 = T_1 \cdot s \cdot G_{LPF}(s) \cdot V + G_{LPF}(s) \cdot V - K \cdot T_2 s \cdot G_{LPF}(s) \cdot I - K \cdot G_{LPF}(s) \cdot I \quad (15)$$

By substituting formula (9) into formula (15), one obtains formula (16).

$$\hat{V}_0 = T_1 \cdot V_2 + V_2 - K \cdot T_2 \cdot I_1 - K \cdot I_1 \quad (16)$$

Consequently, open-circuit voltage $\hat{V}_0$ can be estimated by substituting battery parameters ($\hat{T}_1, \hat{T}_2, \hat{K}$) estimated by using the adaptive digital filter operation and the output ($I_1(k), I_2(k), V_1(k), V_2(k)$) of the pre-processing filter into formula (16). Hence, the method for estimating the open-circuit voltage performed in open-circuit voltage operating part 5 is described.

In the following, the relationship between current I, terminal voltage V, charging percentage SOC and internal resistance K in the case of charging or discharging for a prescribed period of time are explained.

Figure 4:
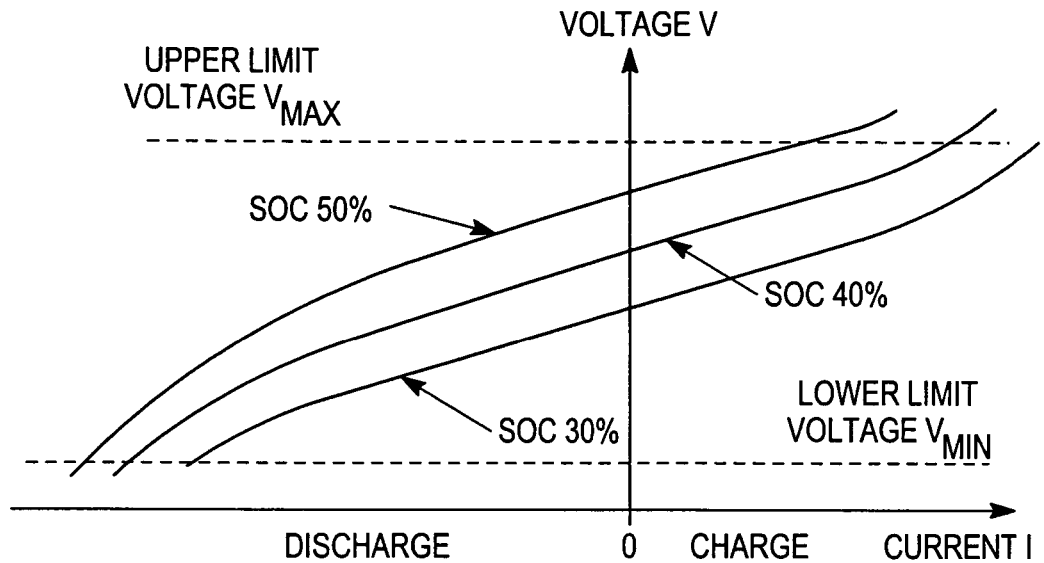
FIG. 4 is a diagram illustrating the relationship between the charging or discharging-current and the terminal voltage of the secondary battery for each SOC (state of charge)
Figure 5:
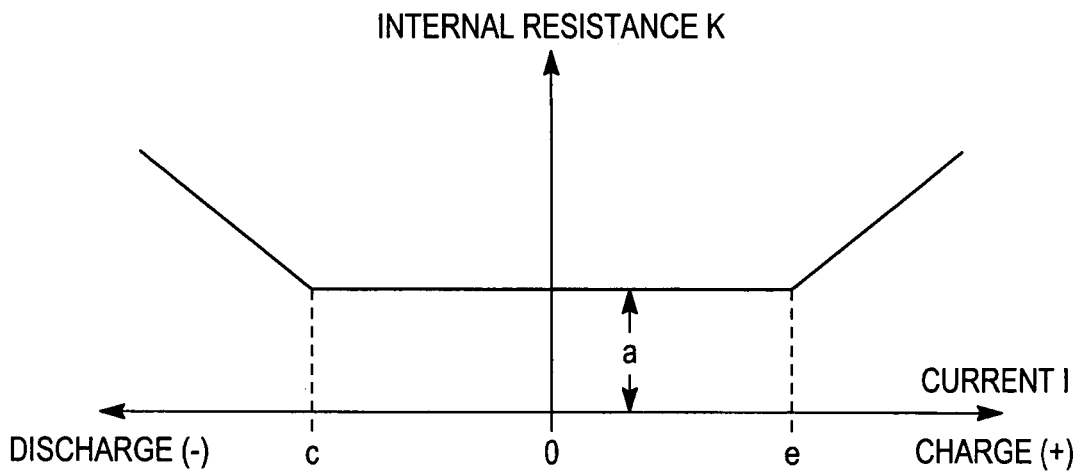
FIG. 5 is a characteristic diagram illustrating the relationship between the charging or discharging current and the internal resistance.

FIG. 4 shows the relationship between the charging or discharging current I and the terminal voltage V of the secondary battery for each charging percentage (state of charge: SOC). In the relatively low current region (i.e., the charging or discharging current is close to 0), the voltage varies linearly with increasing current. In the high current region, the voltage varies non-linearly. This means that the internal resistance increases in the high current region. For example, as shown in FIG. 5, the value of internal resistance K is constant when current I is in a prescribed range ($c \leq I \leq e$) but increases sharply when the current is outside of that range. Here, a positive value of current I indicates charging, while a negative value indicates discharging.

Figure 6:
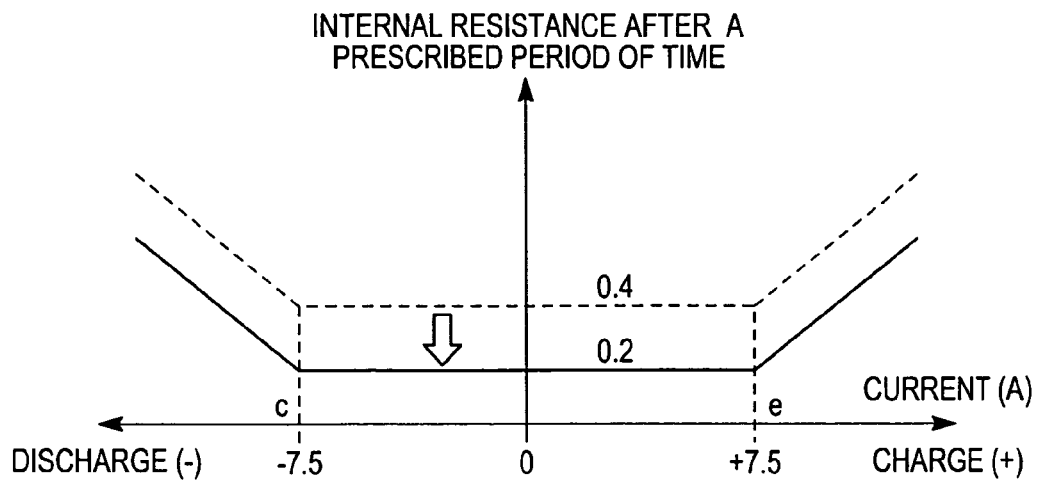
FIG. 6 is a diagram illustrating variation in the internal resistance caused by the state of the battery, such as battery temperature or charging or discharging.

Also, as shown by the broken line and solid line in FIG. 6, the value of internal resistance K varies as a function of the state of the battery, that is, the battery temperature or the extent of degradation of the battery. FIG. 6 shows an example in which the value of internal resistance K decreases from the characteristic indicated by the broken line (the value of the flat part is K=0.4) to the characteristic indicated by the solid line (the value of the flat part is K=0.2). The variation in the internal resistance caused by the state of the battery can be corrected according to formula (21) as described hereinafter.

In the following, three methods are explained with regard to the estimation of the maximum possible charge/discharge current in maximum possible charge/discharge current estimating part 6 shown in FIG. 1. All of these methods take advantage of the fact that the relationship at steady state expressed by formula (4) derived from the equivalent circuit model of the battery shown in FIG. 3 is the following formula (17).

$$V = K \cdot I + V_0 \quad (17)$$

Also, in the first and second methods, the characteristic of internal resistance $K_{Tc}$ with respect to the charging or discharging current I of the battery after a prescribed period $T_c$ (see FIG. 5) is pre-measured empirically, etc. and used. In the following explanation, the characteristic of $K_{Tc}$ is represented by symbol $f_1$ as shown in formula (18).

$$K_{Tc} = f_1(I) \quad (18)$$

Also, the pre-measured characteristic $f_1$ of the internal resistance $K_{Tc}$ with respect to the charging or discharging current I of the battery after a prescribed period $T_c$ can be approximated by a first-order formula in each current region as shown in formula (19).

$$K_{Tc} = f_1(I) = \begin{cases} a + b(I-c): & I < c \\ a: & c \le I \le e \\ a + d(I-e) & e < I \end{cases} \quad (19)$$

wherein a, b, c, d and e are real numbers such that c<e and a>0 and b≠0 and d≠0. Numbers c and e are equivalent to c and e in FIG. 5. The range indicated by c≧I≧e is a prescribed range in which the internal resistance is constant with respect to current.

In this example, the current region is divided into three regions for approximating the characteristic of internal resistance $K_{Tc}$ with respect to charging or discharging current I after a prescribed period $T_c$. The number of current regions, however, is not limited to three. In general, the characteristic of internal resistance $K_{Tc}$ with respect to charging or discharging current I after a prescribed period of time is a curve. However, the curve can be approximated by a straight line over a small region with a small error. By finely dividing the current region for straight line approximation, the approximation accuracy of the internal resistance can be improved. As a result, the accuracy of estimating the inputtable/outputtable power can be improved.

Also, in the first and second methods that estimate the maximum possible charge/discharge current to be described hereinafter, the characteristic $f_1$ of internal resistance $K_{Tc}$ with respect to charging or discharging current I after prescribed period $T_c$ is corrected as follows using the estimated internal resistance $\hat{K}(k)$ included in estimated battery parameters $\hat{\theta}(k)$ and estimated by adaptive digital filter operating part 4 and current I(k) detected by current detecting part 1.

In other words, in the region in which the variation in the pre-measured internal resistance $K_{Tc}$ after a prescribed period $T_c$ can be ignored near the current value I(k) detected by current detecting part 1 (for example, in the region of c≦I(k) ≦e in FIG. 5, the internal resistance is constant in this region), the difference ΔK between the internal resistance $K_{Tc}=f_1\{I(k)\}$ after a prescribed period $T_c$ corresponding to current value I(k) detected by current detecting part 1 and the internal resistance $\hat{K}(k)$ estimated by adaptive digital filter operating part 4 is found by formula (20).

$$\Delta K = \hat{K}(k) - f_1(I(k)) \quad (20)$$

The difference ΔK is added to the pre-measured characteristic of internal resistance $K_{Tc}$ after prescribed period $T_c$ for correction. The formula for correction is shown in formula (21).

$$K_{Tc} = f_1(I) + \Delta K = f_1(I) + (\hat{K}(k) - f_1(I(k))) \quad (21)$$

In other regions, that is, the regions with the charging or discharging current greater than the prescribed value (for example, regions of c≧I(k) or e≦I(k) in FIG. 5), since the internal resistance obtained by means of adaptive digital filter operation is unreliable, no correction is performed using the value obtained by means of adaptive digital filter operation in that range. Instead, the difference ΔK obtained in the region wherein the internal resistance is constant (the value in the region with constant internal resistance) is used for correction. In other words, the pre-measured characteristic $f_1$ of internal resistance $K_{Tc}$ with respect to charging or discharging current I after prescribed period $T_c$ is corrected by shifting the entire curve in parallel by as much as difference ΔK (the value in the region with constant internal resistance). For example, in FIG. 6, when the pre-measured characteristic $f_1$ of internal resistance $K_{Tc}$ with respect to charging or discharging current I after prescribed period $T_c$ is represented by the broken line (flat part is 0.4) and difference ΔK=−0.2, characteristic $f_1$ is shifted down in parallel by as much as 0.2 to obtain corrected characteristic $f_1$ (the solid line).

In other words, since the internal resistance estimated in adaptive digital filter operating part 4 at that time point takes battery temperature and extent of degradation into consideration, when the correction is made by adding/subtracting difference ΔK between that estimated value and the pre-measured characteristic $f_1$ of internal resistance $K_{Tc}$ with respect to characteristic $f_1$, the variation in the internal resistance caused by the battery temperature or extent of degradation can be corrected.

When the pre-measured characteristic $f_1$ of internal resistance $K_{Tc}$ with respect to charging or discharging current I after prescribed period $T_c$ is corrected corresponding to the internal resistance derived by means of adaptive digital filter operation as described above, the current-internal resistance characteristic is changed adaptively corresponding to the change in the battery state (battery temperature or extent of degradation of the battery). Consequently, the accuracy of estimating the inputtable/outputtable power can be improved.

Next, the corrected "current-internal resistance" characteristic expressed by formula (21) is changed and will be explained as $K_{Tc}=f_1(I)$.

Note that if prescribed period $T_c$ is assumed to be 0, the power can be considered as the instantaneous maximum power. When prescribed period $T_c$ has a positive value, the maximum power that can be input/output continuously for that prescribed period $T_c$ is computed. This computation can be realized in the same way in both cases. Consequently, in the following explanation, although the prescribed period of time is expressed as $T_c$, there is no particular difference between 0 and a positive value.

The first method for estimating the maximum possible charge/discharge current is explained. This method takes the variation of the internal resistance caused by charging or discharging into consideration.

Formula (19), which shows the pre-measured characteristic of internal resistance $K_{Tc}$ with respect to charging or discharging current I of the battery after prescribed period $T_c$, and the relationship formula (formula (17)) at steady state of formula (4) derived from the battery equivalent circuit model of FIG. 3 are used to form simultaneous formulas. These simultaneous formulas are shown collectively as formula (22). However, as described above, formula (19) as the characteristic of internal resistance $K_{Tc}$ is the corrected characteristic expressed by formula (21). In other words, the value "a" in formula (19) is corrected to "a+ΔK."

$$K_{Tc} = f_1(I) = \begin{cases} a + b(I - c): & I < c \\ a: & c \leq I \leq e \\ a + d(I - e): & e < I \end{cases} \quad (19) \quad (22)$$

$$V = f_2(I, K) = K \cdot I + V_0 \quad (17)$$

When open-circuit voltage $\hat{V}_0$ estimated by open-circuit voltage operating part 5 is substituted for open-circuit $V_0$ in formula (17) and terminal voltage V is used as upper limit voltage $V_{MAX}$ or lower limit voltage $V_{MIN}$ and the current at that time is used as maximum possible charge current $I_{MAX}$ or maximum possible discharge current $I_{MIN}$, the second-order formulas regarding maximum possible charge current $I_{MAX}$ and maximum possible discharge current $I_{MIN}$ can be obtained as formula (23) and formula (24), respectively.

$$V_{MAX} = \begin{cases} a \cdot I_{MAX} + \hat{V}_0: & 0 \leq I_{MAX} \leq e \\ (a + d(I_{MAX} - e)) \cdot I_{MAX} + \hat{V}_0: & e < I_{MAX} \end{cases} \quad (23)$$

$$V_{MIN} = \begin{cases} a \cdot I_{MIN} + \hat{V}_0: & c \leq I_{MIN} \leq 0 \\ (a + b(I_{MIN} - c)) \cdot I_{MIN} + \hat{V}_0: & I_{MIN} < c \end{cases} \quad (24)$$

As will be explained in step 5-B in FIG. 8, when the charging current is outside of the prescribed range, since the estimated open-circuit voltage $\hat{V}_0$ computed using the value estimated by means of the adaptive digital filter operation is unreliable, the estimated open-circuit voltage derived using another method (such as the method using current integration) is used.

By solving these formulas using the formula of the solutions of the second-order formulas, maximum possible charge current $I_{MAX}$ and maximum possible discharge current $I_{MIN}$ can be estimated as shown in formula (25) and formula (26), respectively.

$$\hat{I}_{MAX} = \begin{cases} \dfrac{V_{MAX} - \hat{V}_0}{a}: & 0 \leq \hat{I}_{MAX} \leq e \\ \dfrac{-(a - d \cdot e) + \sqrt{(a - d \cdot e)^2 - 4d \cdot (\hat{V}_0 - V_{MAX})}}{2d}: & e < \hat{I}_{MAX} \end{cases} \quad (25)$$

$$\hat{I}_{MIN} = \begin{cases} \dfrac{V_{MIN} - \hat{V}_0}{a}: & c \leq \hat{I}_{MIN} \leq 0 \\ \dfrac{-(a - b \cdot c) - \sqrt{(a - b \cdot c)^2 - 4b \cdot (\hat{V}_0 - V_{MIN})}}{2b}: & \hat{I}_{MIN} < c \end{cases} \quad (26)$$

This completes the first method for estimating the maximum possible charge/discharge current.

Next, the second method of estimating the maximum possible charge/discharge current is explained. This method takes into consideration the variations of the internal resistance and open-circuit voltage caused by charging or discharging.

More specifically, in this method the state of charge (SOC) of the battery varies during charging or discharging for a prescribed period $T_c$. The maximum possible charge/discharge current is estimated by taking the variation of the open-circuit voltage corresponding to the change in the charging percentage into consideration.

Variation $\Delta SOC$ in the SOC that varies during charging or discharging at a charging or discharging current I for prescribed period $T_c$ is expressed by formula (27) using the total capacity Cap (known as "fully charged capacity") of the secondary battery.

$$\Delta SOC = \frac{\int_0^{T_c} I dt}{Cap} \quad (27)$$

If the current is assumed to be constant in formula (27), one obtains formula (28).

$$\Delta SOC = \frac{I \cdot T_c}{Cap} \quad (28)$$

Total capacity Cap can be found by dividing the current by the differentiated value of the estimated charging percentage, for example, as shown in formula (29).

$$Cap = \frac{I}{\dfrac{d}{dt}(SOC)} \quad (29)$$

Figure 7:
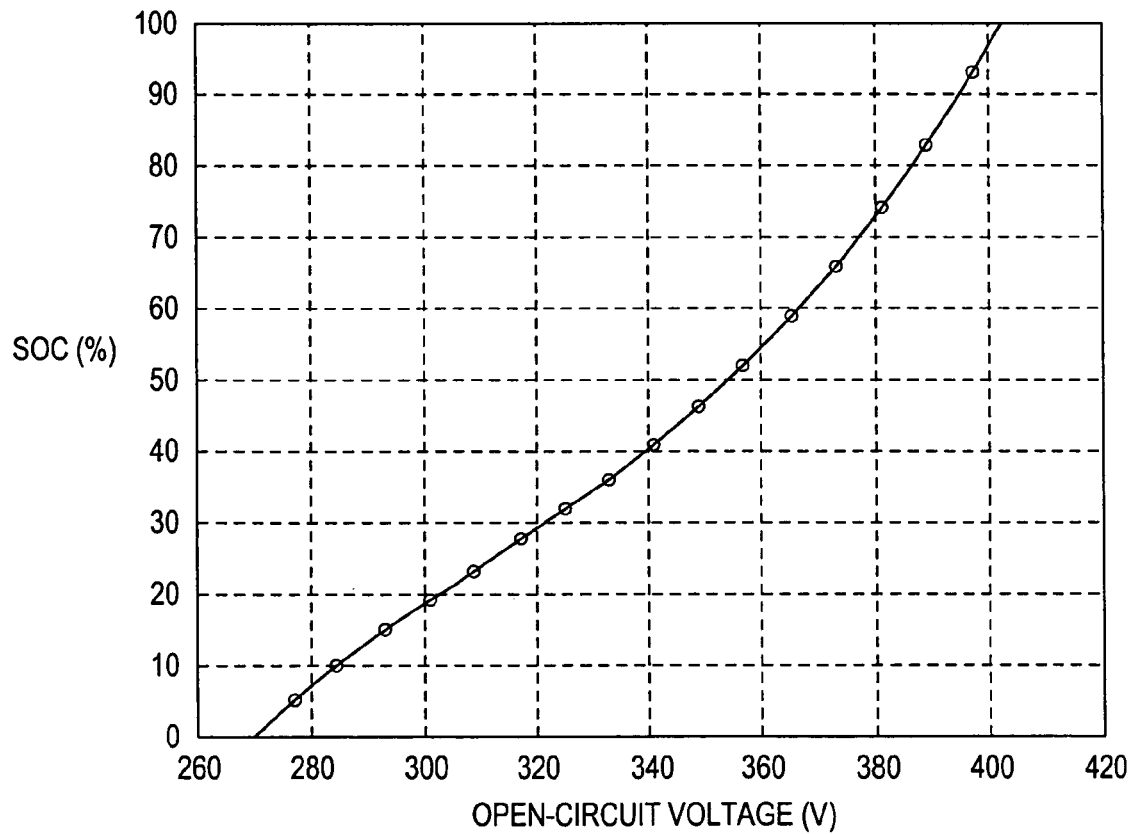
FIG. 7 is a diagram illustrating the state of charge (SOC)—open-circuit voltage characteristic of the battery.

Since there is a relationship that can be determined independently of battery temperature and extent of degradation of the battery between the open-circuit voltage and the SOC as shown in FIG. 7, the charging percentage can be easily found from open-circuit voltage $\hat{V}_0$ estimated by open-circuit voltage computing part 5 by measuring this characteristic in advance. On the other hand, the open-circuit voltage can be easily found from the SOC.

This pre-measured open-circuit voltage—SOC characteristic (FIG. 7) is approximated using the polynomial shown in formula (30).

$$SOC = g(V_0) = a_0 + a_1 \cdot V_0 + a_2 \cdot V_0^2 + a_3 \cdot V_0^3 \quad (30)$$

wherein $a_0$, $a_1$, $a_2$ and $a_3$ are real numbers.

In this application example, a third-order formula is used as the approximation formula for the open-circuit voltage—SOC characteristic. However, other methods can be used.

The slope α of the open-circuit voltage—SOC characteristic near open-circuit voltage $\hat{V}_0$ estimated at the current time by open-circuit voltage computing part 5 is the inverse of the value obtained by substituting estimated open-circuit voltage $\hat{V}_0$ into formula (31), which is the derivative function of formula (30). Therefore, the slope α can be calculated using formula (32).

$$g'(V_0) = \frac{dSOC}{dV_0} = a_1 + 2a_2 \cdot V_0 + 3a_3 \cdot V_0^2 \quad (31)$$

$$\alpha = \frac{1}{\left.\dfrac{dSOC}{dV_0}\right|_{\hat{V}_0}} = \frac{1}{g'(\hat{V}_0)} = \frac{1}{a_1 + 2a_2 \cdot \hat{V}_0 + 3a_3 \cdot \hat{V}_0^2} \quad (32)$$

Consequently, the variation $\Delta V_0$ in the open-circuit voltage corresponding to the variation $\Delta SOC$ of the SOC that varies during charging or discharging at charging or discharging current I for a prescribed period $T_c$ can be approximated using formula (33).

$$\Delta V_0 = \alpha \cdot \Delta SOC = \frac{1}{g'(\hat{V}_0)} \cdot \frac{I \cdot T_c}{Cap} \tag{33}$$

Then, formula (19) expressing the pre-measured characteristic of internal resistance $K_{Tc}$ with respect to the charging or discharging current I of the battery after a prescribed period $T_c$, formula (33), the relationship formula of variation $\Delta V_0$ in the open-circuit voltage corresponding to the variation $\Delta SOC$ in the SOC that varies during charging or discharging at charging or discharging current I for a prescribed period $T_c$, formula (34) obtained by adding variation $\Delta V_0$ in the open-circuit voltage that varies after charging or discharging for prescribed period $T_c$ of formula (21) as a correction to formula (17), which is the relationship formula of formula (4) derived from the battery equivalent circuit model of FIG. 3 at steady state, are used to form simultaneous formulas. The simultaneous formulas are collectively shown as formula (35). In this case, formula (19) expressing the characteristic of internal resistance $K_{Tc}$ is the characteristic after being corrected by formula (21).

$$\begin{cases} K_{Tc} = f_1(I) = \begin{cases} a + b(I-c): & I < c \\ a: & c \leq I \leq e \\ a + d(I-e): & e < I \end{cases} & (19) \\ \Delta V_0 = \frac{1}{g'(\hat{V}_0)} \cdot \frac{I \cdot T_c}{Cap} & (33) \\ V = f_2(I, K) = K \cdot I + (V_0 + \Delta V_0) & (34) \end{cases} \tag{35}$$

When open-circuit voltage $V_0$ estimated by open-circuit voltage computing part 5 is substituted for open-circuit voltage $V_0$ in formula (34), terminal voltage V is used as upper limit voltage $V_{MAX}$ or lower limit voltage $V_{MIN}$, and the current at that time is used as maximum possible charge current $I_{MAX}$ or maximum possible discharge current $I_{MIN}$, the second-order formulas regarding maximum possible charge current $I_{MAX}$ and maximum possible discharge current $I_{MIN}$ can be obtained as shown in formula (36) and formula (37), respectively.

$$V_{MAX} = \tag{36}$$

$$\begin{cases} a \cdot I_{MAX} + \hat{V}_0 + \frac{1}{g'(\hat{V}_0)} \cdot \frac{I_{MAX} \cdot T_c}{Cap}: & 0 \leq I_{MAX} \leq e \\ (a + d(I_{MAX} - e)) \cdot I_{MAX} + \hat{V}_0 + \frac{1}{g'(\hat{V}_0)} \cdot \frac{I_{MAX} \cdot T_c}{Cap}: & e < I_{MAX} \end{cases}$$

$$V_{MIN} = \tag{37}$$

$$\begin{cases} a \cdot I_{MIN} + \hat{V}_0 + \frac{1}{g'(\hat{V}_0)} \cdot \frac{I_{MIN} \cdot T_c}{Cap}: & c \leq I_{MIN} \leq 0 \\ (a + b(I_{MIN} - c)) \cdot I_{MIN} + \hat{V}_0 + \frac{1}{g'(\hat{V}_0)} \cdot \frac{I_{MIN} \cdot T_c}{Cap}: & I_{MIN} < c \end{cases}$$

In this case, when the charging current is outside of the prescribed range, since the estimated open-circuit voltage $\hat{V}_0$ computed using the value estimated by means of adaptive digital filter operation is unreliable, the estimated open-circuit voltage derived using another method (such as the method using current integration) is used.

By solving these equations using the formula for the solutions of the second-order formulas, maximum possible charge current $I_{MAX}$ and maximum possible discharge current $I_{MIN}$ can be estimated as shown in formula (38) and formula (39), respectively.

$$\hat{I}_{MAX} = \tag{38}$$

$$\begin{cases} \dfrac{V_{MAX} - \hat{V}_0}{a + \dfrac{T_c}{g'(\hat{V}_0) \cdot Cap}}: & 0 \leq \hat{I}_{MAX} \leq e \\ \dfrac{-\left(a - d \cdot e + \dfrac{T_c}{g'(\hat{V}_0) \cdot Cap}\right) +}{\sqrt{\left(a - d \cdot e + \dfrac{T_c}{g'(\hat{V}_0) \cdot Cap}\right)^2 - 4d \cdot (\hat{V}_0 - V_{MAX})}} \\ \dfrac{}{2d}: & e < \hat{I}_{MAX} \end{cases}$$

$$\hat{I}_{MIN} = \tag{39}$$

$$\begin{cases} \dfrac{V_{MIN} - \hat{V}_0}{a + \dfrac{T_c}{g'(\hat{V}_0) \cdot Cap}}: & c \leq \hat{I}_{MIN} \leq 0 \\ \dfrac{-\left(a - b \cdot c + \dfrac{T_c}{g'(\hat{V}_0) \cdot Cap}\right) -}{\sqrt{\left(a - b \cdot c + \dfrac{T_c}{g'(\hat{V}_0) \cdot Cap}\right)^2 - 4b \cdot (\hat{V}_0 - V_{MIN})}} \\ \dfrac{}{2b}: & \hat{I}_{MIN} < c \end{cases}$$

Thus is concluded the second method for estimating the maximum possible charge/discharge current.

Next, the third method for estimating the maximum possible charge/discharge current is explained. This method takes into consideration the variation in the open-circuit voltage caused by charging or discharging.

Variation $\Delta V_0$ in the open-circuit voltage that varies during charging or discharging at charging or discharging current I for prescribed period $T_c$ expressed by formula (33) and formula (34) obtained by adding variation $\Delta V_0$ in the open-circuit voltage that varies during charging or discharging for prescribed period $T_c$ of formula (33) to the relationship formula (formula (17)) in the steady state of formula (4) derived from the equivalent circuit model are used to form simultaneous formulas. The simultaneous formulas are expressed below as formula (40).

$$\begin{cases} \Delta V_0 = \dfrac{1}{g'(\hat{V}_0)} \cdot \dfrac{I \cdot T_c}{Cap} & (33) \\ V = f_2(I, K) = K \cdot I + (V_0 + \Delta V_0) & (34) \end{cases} \tag{40}$$

When $\hat{K}$ included in internal parameter θ estimated by adaptive digital filter operating part 4 is substituted for the internal resistance, and open-circuit voltage $\hat{V}_0$ estimated by open-circuit voltage computing part 5 is substituted for $V_0$ in formula (34), and terminal voltage V is used as upper limit voltage $V_{MAX}$ (terminal voltage immediately before the battery is overcharged) or lower limit voltage $V_{MIN}$ (terminal voltage immediately before the battery is over-discharged), and the current at that time is used as maximum possible charge current $I_{MAX}$ or maximum possible discharge current $I_{MIN}$, the second-order formulas regarding maximum possible charge current $I_{MAX}$ and maximum possible discharge current $I_{MIN}$ can be obtained as shown in formula (41) and formula (42), respectively.

$$V_{MAX} = \hat{K} \cdot I_{MAX} + \hat{V}_0 + \frac{1}{g'(\hat{V}_0)} \cdot \frac{I_{MAX} \cdot T_c}{Cap} \quad (41)$$

$$V_{MIN} = \hat{K} \cdot I_{MIN} + \hat{V}_0 + \frac{1}{g'(\hat{V}_0)} \cdot \frac{I_{MIN} \cdot T_c}{Cap} \quad (42)$$

In this case, when the charging current is outside of the prescribed range, since the estimated open-circuit voltage $\hat{V}_0$ computed using the value estimated by means of the adaptive digital filter operation is unreliable, the estimated open-circuit voltage derived using another method (such as the method using current integration) is used.

Maximum possible charge current $I_{MAX}$ and maximum possible discharge current $I_{MIN}$ can be estimated by solving formula (43) and formula (44), respectively.

$$\hat{I}_{MAX} = \frac{V_{MAX} - \hat{V}_0}{\hat{K} + \frac{T_c}{g'(\hat{V}_0) \cdot Cap}} \quad (43)$$

$$\hat{I}_{MIN} = \frac{V_{MIN} - \hat{V}_0}{\hat{K} + \frac{T_c}{g'(\hat{V}_0) \cdot Cap}} \quad (44)$$

Hence, the third method for estimating the maximum possible charge/discharge current has been explained above.

Next, the method for estimating the inputtable/outputtable power by inputtable/outputtable power computing part 7 shown in FIG. 1 is explained.

The maximum possible charge current (estimated value) $\hat{I}_{MAX}$ and the maximum possible discharge current (estimated value) $\hat{I}_{MIN}$ estimated by maximum possible charge/discharge current estimating part 6 using one of the three methods, and upper limit voltage $V_{MAX}$ and lower limit voltage $V_{MIN}$ are used to compute inputtable power $P_{in}$ and outputtable power $P_{out}$ using formula (45) and formula (46), respectively.

$$P_{in} = \hat{I}_{MAX} \cdot V_{MAX} \quad (45)$$

$$P_{out} = |\hat{I}_{MIN}| \cdot V_{MIN} \quad (46)$$

The inputtable/outputtable power estimating method explained above will be explained further using the flow chart of FIG. 8 that illustrates the process performed by electronic control unit 30 shown in FIG. 2. The process shown in FIG. 8 is carried out at each period $T_0$ ($T_0$=50 msec in this application example). In the following explanation, I(k) represents the current value for the current period, and I(k−1) represents the current value for the previous period. The values other than the current are represented by the same symbols used above.

In step 1, charging or discharging current I(k) is detected on the basis of the signal sent from current sensor 40, and terminal voltage V(k) of the secondary battery is detected on the basis of the signal sent from voltage sensor 50.

In step 2, low-pass filter processing and approximate differential filter processing are performed from current I(k) and voltage V(k) detected in step 1 to calculate $I_1(k)$, $I_2(k)$, $I_3(k)$ and $V_1(k)$, $V_2(k)$, $V_3(k)$ on the basis of formula (47) and formula (48).

$$\left. \begin{array}{ll} I_1(k) = G_{LPF}(s) \cdot I(k) & V_1(k) = G_{LPF}(s) \cdot V(k) \\ I_2(k) = s \cdot G_{LPF}(s) \cdot I(k) & V_2(k) = s \cdot G_{LPF}(s) \cdot V(k) \\ I_3(k) = s^2 \cdot G_{LPF}(s) \cdot I(k) & V_3(k) = s^2 \cdot G_{LPF}(s) \cdot V(k) \end{array} \right\} \quad (47)$$

$$G_{LPF}(s) = \frac{1}{(p \cdot s + 1)^3} \quad (48)$$

These variables can be calculated using the approximation formulas obtained by discretizing formula (47) and formula (48) by means of a Tustin approximation, etc.

In step 3 the variables $I_1(k)$, $I_2(k)$, $I_3(k)$, $V_2(k)$ and $V_3(k)$ calculated in step 2 are used to calculate estimated battery parameter $\hat{\theta}(k)$ by the adaptive digital filter operation expressed by formula (13).

In formula (13), the parameters y(k), $\omega^T(k)$ and $\theta(k)$ are expressed in formula (49).

$$y(k) = V_2(k)$$

$$\omega^T(k) = [V_3(k) \, I_3(k) \, I_2(k) \, I_1(k)]$$

$$\hat{\theta}(k) = [-\hat{T}_1(k) \, \hat{K}(k) \cdot \hat{T}_2(k) \, \hat{K}(k) \hat{h}(k)] \quad (49)$$

In step 4 it is determined whether the current detected in step 1 is in a region (c≦I(k)≦e) where the variation in the internal resistance with respect to the current can be ignored in the first-order approximation characteristic of the prescribed pre-measured current—internal resistance characteristic. If the current is in such a region, the process goes to step 5-A and step 6. If the current is not in such a region, the process goes to step 5-B.

In step 5-A parameters $\hat{T}_1(k), \hat{K}(k), \hat{T}_2(k)$ from the battery parameters calculated in step 3, and $I_1(k)$, $I_2(k)$, $V_1(k)$ and $V_2(k)$ calculated in step 2 are substituted into formula (15) to calculate the estimated open-circuit voltage $\hat{V}_0$.

If it was found in step 4 that the current is in a region where the variation in the internal resistance with respect to the current can be ignored in the first-order approximation characteristic of the prescribed pre-measured current—internal resistance characteristic, in step 6 formula (21) is used to correct the pre-measured characteristic of internal resistance $K_{Tc}$ with respect to charging or discharging current I of the battery after prescribed period $T_c$. As described above, if the current is outside such a region, the pre-measured characteristic $f_1$ of internal resistance $K_{Tc}$ with respect to charging or discharging current I is corrected by shifting the entire characteristic curve in parallel by as much as difference ΔK (the value in the region where the internal resistance is constant).

In step 5-B, the open-circuit voltage is estimated using a different method from that described in step 5-A. The estimation of the open-circuit voltage by means of the adaptive digital filter operation is difficult since the internal resistance increases along with high-current charging or discharging, so an open-circuit voltage estimation method that can estimate the open-circuit voltage without using the adaptive digital filter operation is used. Well-known examples of such methods include the method that computes SOC by integrating the current and uses the pre-measured open-circuit voltage—SOC characteristic shown in FIG. 7 to estimate the open-circuit voltage from the SOC and the method using a Kalman filter (see Japanese Kokai Patent Application No. 2000-323183).

In step 7 one of the first through third methods used for estimating the maximum possible charge/discharge current is used to compute maximum possible charge current (estimated value) $\hat{I}_{MAX}$ and maximum possible discharge current (estimated value) $\hat{I}_{MIN}$ from the corrected characteristic of internal resistance $K_{Tc}$ with respect to charging or discharging current I of the battery after prescribed period $T_c$ and the estimated open-circuit voltage $\hat{V}_0$ computed in step 5-A or 5-B.

In step 8 maximum possible charge current (estimated value) $\hat{I}_{MAX}$ and maximum possible discharge current (estimated value) $\hat{I}_{MIN}$ computed in step 7 as well as upper limit voltage $V_{MAX}$ and lower limit voltage $V_{MIN}$ are used to compute inputtable power $P_{in}$ and outputtable power $P_{out}$ using formula (45) and formula (46), respectively.

In the next step, step 9, the data needed for the next cycle of computations are stored, and the computations of the current cycle come to an end.

Figure 9:
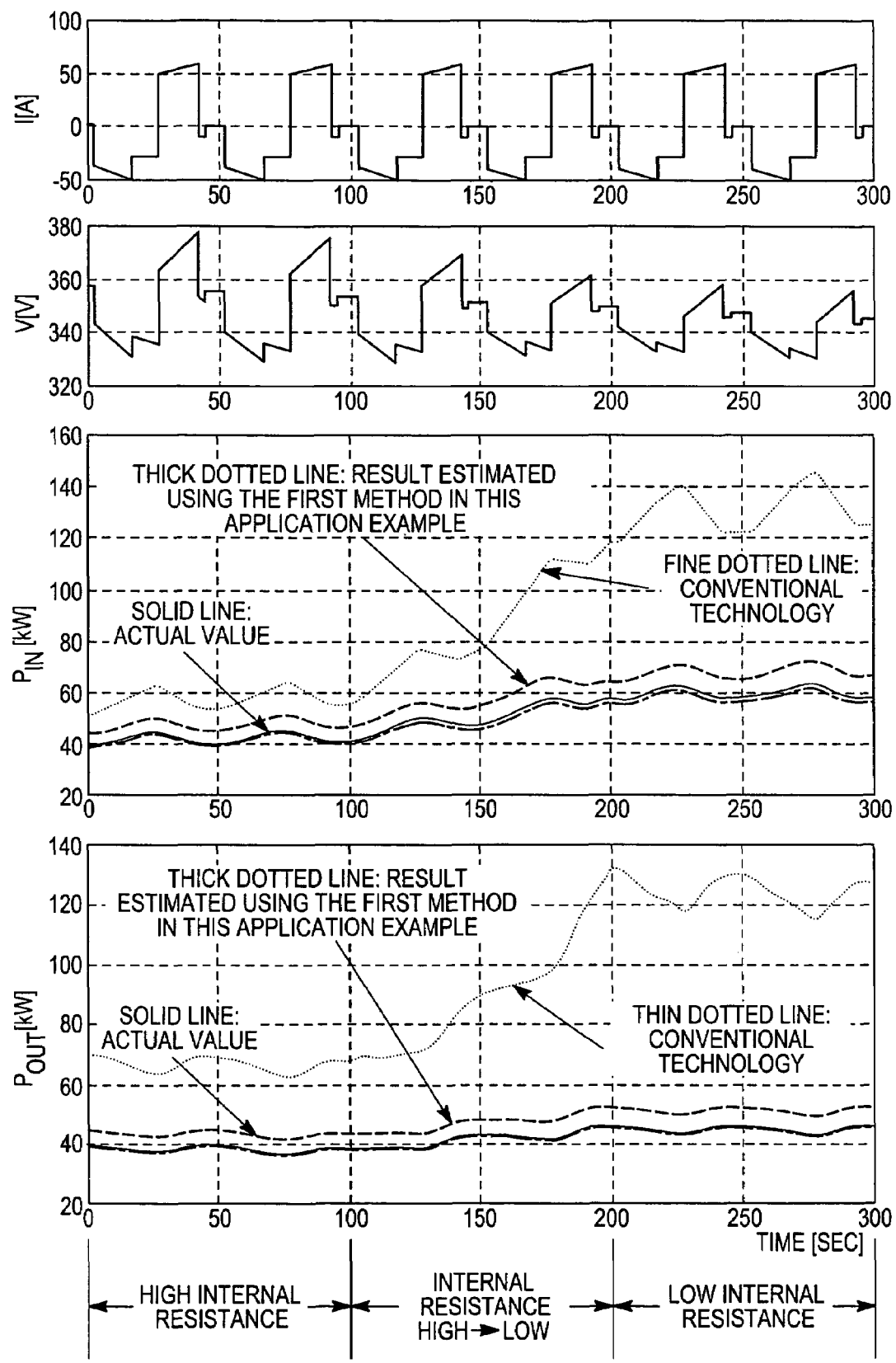
FIG. 9 is a diagram illustrating the results of verifying the effects of embodiments of the invention by means of a simulation using the battery model.
Figure 10:
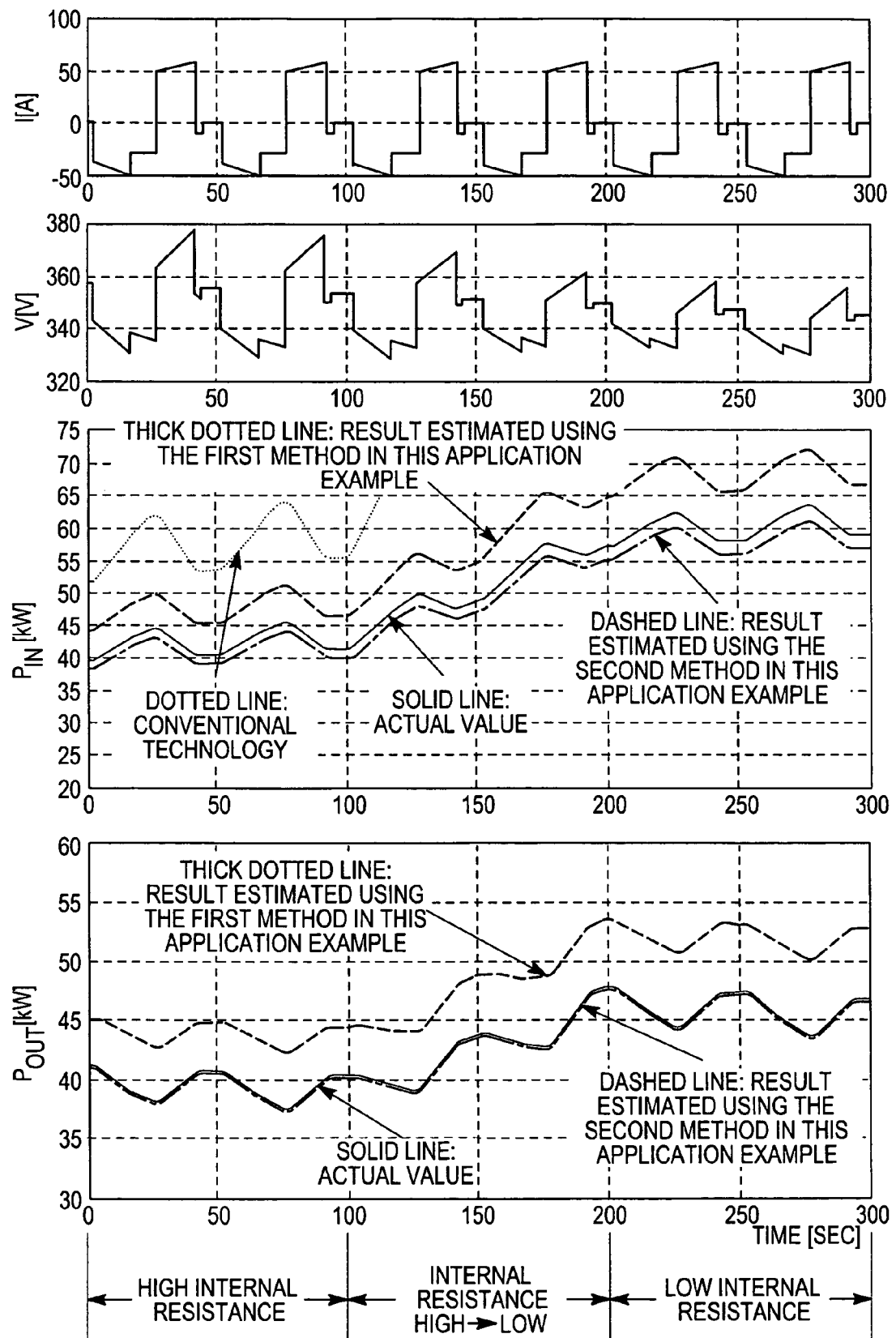
FIG. 10 is a detailed diagram of part of FIG. 9.

FIGS. 9 and 10 are diagrams illustrating the results of verifying the effects of the first and second methods for estimating the maximum possible charge/discharge current by means of simulation using a battery model.

In FIG. 9 the actual values and estimated values of current I, terminal voltage V, inputtable power $P_{in}$ and outputtable power $P_{out}$ are shown at the top. In the graph of inputtable power $P_{in}$ and outputtable power $P_{out}$, the actual value is indicated by the solid line. The result estimated according to the first method of the present invention is indicated by the thick dotted line. The result estimated according to the second method of the present invention is indicated by the dashed line, and the result estimated using the conventional technology is indicated by the thin dotted line.

FIG. 10 is a detailed diagram of part of FIG. 9. In this diagram, the ordinate scale for inputtable power $P_{in}$ and outputtable power $P_{out}$ has been increased by about a factor of three. In FIG. 10, the actual value is indicated by the solid line. The result estimated using the conventional technology is indicated by the fine dotted line. The inputtable/outputtable power estimated using the first method in this application example is indicated by the thick dotted line. The inputtable/outputtable power estimated using the second method in this application example is indicated by the dashed line. The conditions assumed for the battery model are total capacity 3.53 Ah with initial SOC=40%. For the current—internal resistance characteristic, 0-100 sec is equivalent to 25° C. (characteristic indicated by the broken line in FIG. 6). 200 sec and thereafter is the characteristic indicated by the solid line in FIG. 6. In the period of 100-200 sec, the characteristic is changed continuously from the characteristic indicated by the broken line in FIG. 6 to the characteristic indicated by the solid line. Also, the prescribed time $T_c$ for maintaining the maximum input/output power is 10 sec.

For the simulation results obtained using the conventional technology and indicated by the fine dotted line in FIGS. 9 and 10, since the fact that the internal resistance characteristic after 10 sec is different from the internal resistance characteristic at the current time as well as the variation in the open-circuit voltage that occurs during 10 sec of charging or discharging are not taken into consideration, there is large error in the estimated power.

On the other hand, for the results estimated using the first method in this application example indicated by the thick dotted line, since the inputtable/outputtable power is computed while making a prediction based on the current-internal resistance characteristic obtained by pre-measuring the internal resistance after 10 sec, the estimation accuracy is improved. Also, even if a variation in the current-internal resistance characteristic occurs accompanying the change in the battery state, since it is possible to adaptively correct the pre-measured current-internal resistance characteristic using the estimated value of the internal resistance of 100 sec+ current time, a highly accurate estimation can be obtained.

For the results estimated using the second method in this application example indicated by the dashed line, besides computing the inputtable/outputtable power while making a prediction based on the current-internal resistance characteristic obtained by pre-measuring the internal resistance after 10 sec, the inputtable/outputtable power is estimated while taking the variation in the open-circuit voltage that occurs during 10 sec of charging or discharging into consideration, and the estimation accuracy can be further improved.

Figure 11:
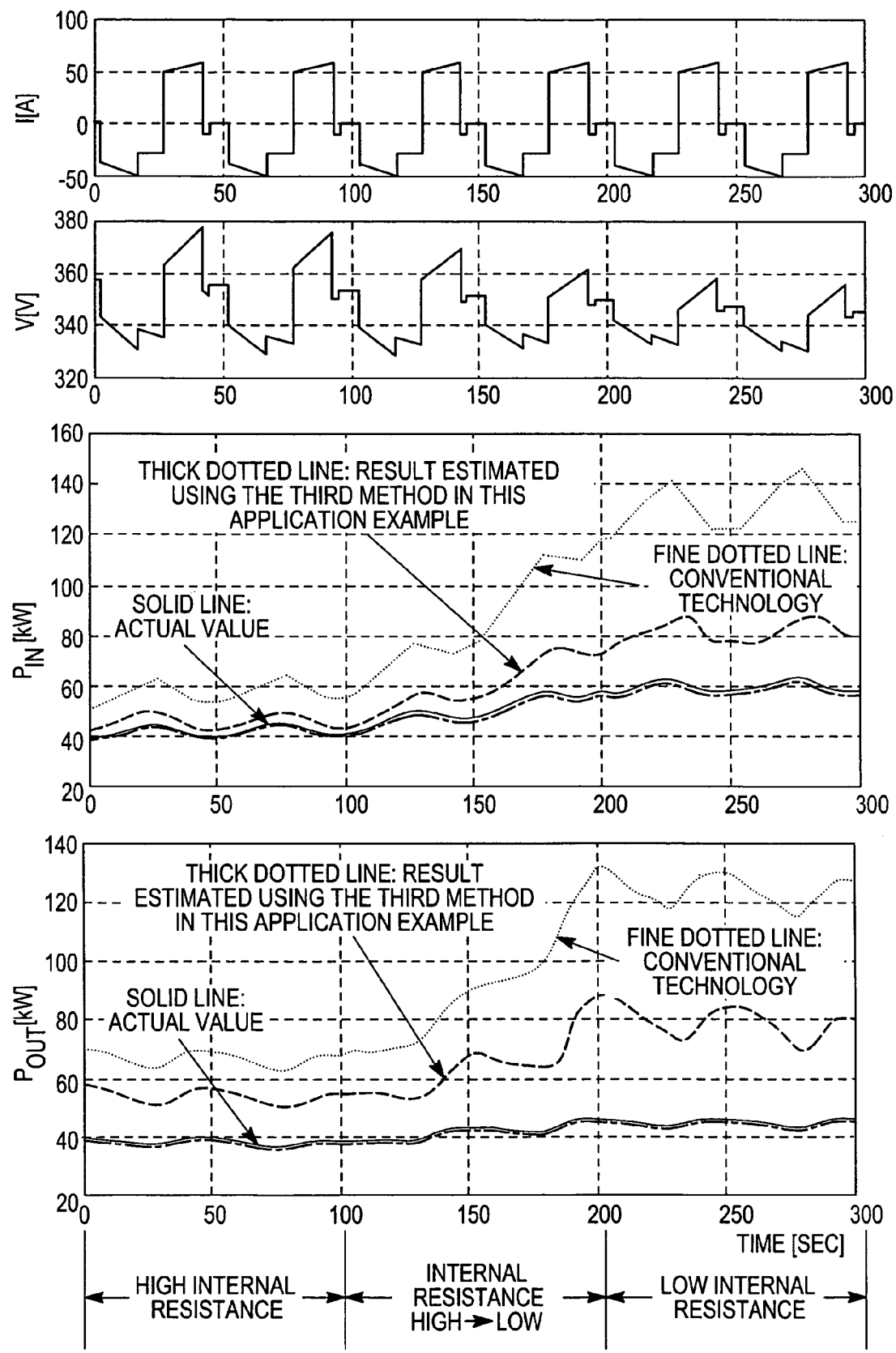
FIG. 11 is a diagram illustrating the results of verifying the effects of embodiments of the invention by means of a simulation using the battery model.
Figure 12:
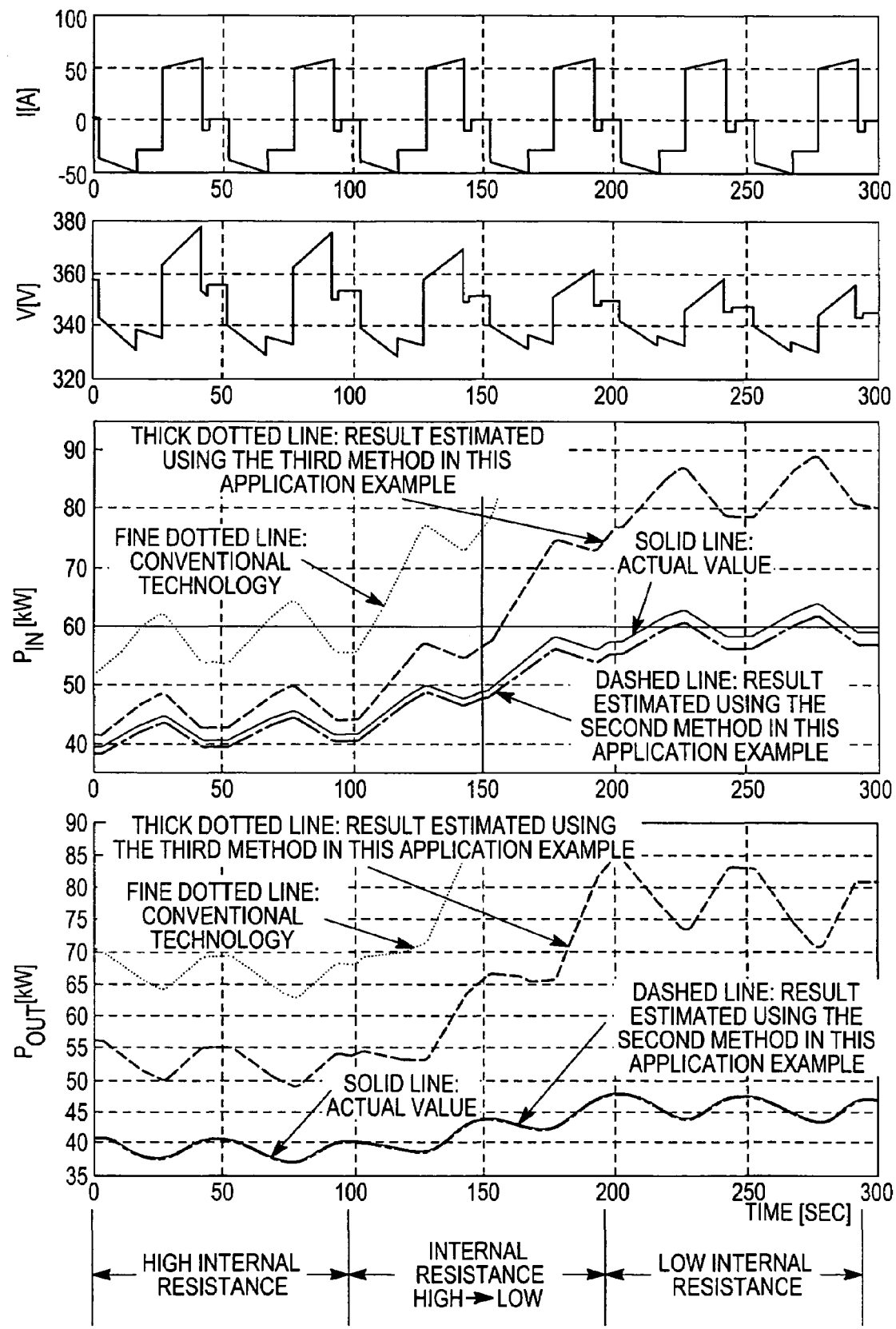
FIG. 12 is a detailed diagram of part of FIG. 11.

FIGS. 11 and 12 are diagrams illustrating the results of verifying the effect of the third method used for estimating the maximum possible charge/discharge current by means of simulation using the battery model. FIG. 12 is a detailed diagram of part of FIG. 11.

In FIGS. 11 and 12, the conditions assumed for the battery model are the same as those for FIGS. 9 and 10.

As can be seen from FIGS. 11 and 12, for the results estimated by the third method indicated by the thick dotted line, since the inputtable/outputtable power is estimated while taking the variation in the open-circuit voltage that occurs during 10 sec of charging or discharging into consideration, the estimation accuracy is improved.

In the following, a comparison between a conventional example (the inputtable/outputtable power estimating device disclosed in Japanese Kokai Patent Application No. 2004-264126) and the case of applying the present invention to a battery used as the power supply for driving a vehicle will be explained.

Since the inputtable/outputtable power estimated using the conventional technology does not take into consideration the variation in the battery state caused by a prescribed period of charging or discharging, the estimated inputtable/outputtable power is the instantaneous inputtable/outputtable power instead of a power that can continue for a prescribed period of time. Consequently, if the vehicle is accelerated at maximum power that is based on that estimated inputtable/outputtable power, the voltage will drop instantaneously to reach the lower limit voltage. After that, the outputtable power is reduced corresponding to the change in the battery state (internal resistance or open-circuit voltage, that is, charging percentage). As a result, the acceleration will decrease significantly to deteriorate the acceleration performance of the vehicle. With the method taught herein, however, since the inputtable/outputtable power that can be maintained for a prescribed period of time can be estimated accurately, if the vehicle is accelerated at maximum power based on the outputtable power estimated according to the teachings herein, the acceleration will not drop significantly for at least a prescribed period of time (for example, 10 sec). Thus, the problem of the conventional technology can be solved. Similarly, for the inputtable power, a constant input power can be maintained for at least a prescribed period of time. Charging can be performed efficiently without frequently upsetting the balance between charging and discharging.

As explained on the basis of formula (21), when the pre-measured characteristic $f_1$ of internal resistance $K_{Tc}$ with respect to charging or discharging current I after prescribed period $T_c$ is corrected corresponding to the internal resistance derived by means of the adaptive digital filter operation, the current-internal resistance characteristic is changed to adaptively correspond to the change in the battery state (battery temperature or extent of degradation of the battery). Therefore, the accuracy of estimating the inputtable/outputtable power can be improved. In other words, the change in the internal resistance that accompanies the change in the battery state (temperature or extent of degradation) that cannot be reflected in the pre-measured current-internal resistance characteristic can be taken into consideration.

As explained on the basis of formula (19), when the maximum possible charge/discharge current that does not exceed the upper or lower limit voltage is derived by approximating the pre-measured current-internal resistance characteristic with a straight line, the calculation can be easily performed by means of an algebraic calculation instead of using a convergence calculation. Since the number of computations is reduced compared to the convergence calculation, the processing can be easily realized with a microcomputer incorporated in the vehicle.

Also, the above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A power estimating device for estimating a power associated with a secondary battery, the power comprising at least one of an inputtable power to charge the battery and an outputtable power discharged from the battery, the device comprising:

a controller including:

a maximum possible current estimating part operable to estimate a maximum possible current through the secondary battery when the terminal voltage of the secondary battery reaches one of an upper limit voltage when the secondary battery is charged continuously for a first period of time and a lower limit voltage when the secondary battery is discharged continuously for a second period of time; and a power estimating part operable to estimate the power based on the maximum possible current and the one of the upper limit voltage and the lower limit voltage.

2. The device according to claim 1 wherein the maximum possible current estimating part is further operable to estimate at least one of a maximum possible charge current based on a correlation between a first current of the secondary battery after a prescribed charging period and an internal resistance of the secondary battery and the upper limit voltage, and a maximum possible discharge current based on a correlation between a second current of the secondary battery after a prescribed discharge period and the internal resistance of the secondary battery and the lower limit voltage.

3. The device according to claim 2, wherein the maximum possible current estimating part is further operable to:

estimate an estimated internal resistance $\hat{K}(k)$ by means of a batch estimation performed using a digital filtering operation that uses battery parameters including an internal resistance in a battery model formula expressed by:

$$V = \frac{B(s)}{A(s)} \cdot I + \frac{1}{C(s)} \cdot V_0;$$

wherein $$A(s) = \sum_{k=0}^{n} a_k \cdot s^k;$$

$$B(s) = \sum_{k=0}^{n} b_k \cdot s^k;$$

$$C(s) = \sum_{k=0}^{n} c_k \cdot s^k;$$

V is the terminal voltage;
$V_0$ is an open-circuit voltage;
I is current through the secondary battery;
s denotes a LaPlace transform operator;
A(s), B(s) and C(s) denote each polynomial of s (n denotes degrees); and
$a_1 \neq 0$, $b_1 \neq 0$ and $c_1 \neq 0$;

correct a pre-measured correlation between at least one of the first current and the second current through the secondary battery and the internal resistance of the secondary battery after the respective prescribed charging or discharge period based on the estimated internal resistance $\hat{K}(k)$; and estimate the at least one of the maximum possible charge current based on a corrected correlation between the first current and internal resistance and on the upper limit voltage, and the maximum possible discharge current based on a corrected correlation between the second current and the internal resistance and the lower limit voltage.

4. The device according to claim 1 wherein the controller is operable to estimate a variation in an open-circuit voltage of the secondary battery that occurs during one of charging and discharging at a prescribed current for the respective first or second period of time; and wherein the maximum possible current estimating part is further operable to estimate the maximum possible current based on the variation in the open-circuit voltage and a respective one of the upper limit voltage and the lower limit voltage.

5. The device according to claim 1 wherein the maximum possible current estimating part is further operable to estimate the maximum possible current based on a correlation between a current of the secondary battery after a prescribed period of one of charging and discharging the secondary battery and an internal resistance of the secondary battery, a variation in an open-circuit voltage of the secondary battery that occurs during the one of charging and discharging at a prescribed current for the prescribed period, and a respective one of the upper limit voltage and the lower limit voltage.

6. The device according to claim 5 wherein the maximum possible current estimating part is further operable to:

estimate an estimated internal resistance $\hat{K}(k)$ by means of a batch estimation performed using a digital filtering operation that uses battery parameters including an internal resistance in a battery model formula expressed by:

$$V = \frac{B(s)}{A(s)} \cdot I + \frac{1}{C(s)} \cdot V_0;$$

wherein $$A(s) = \sum_{k=0}^{n} a_k \cdot s^k;$$

$$B(s) = \sum_{k=0}^{n} b_k \cdot s^k;$$

$$C(s) = \sum_{k=0}^{n} c_k \cdot s^k;$$

V is the terminal voltage;
$V_0$ is an open-circuit voltage;
I is current through the secondary battery;
s denotes a LaPlace transform operator;
A(s), B(s) and C(s) denote each polynomial of s (n denotes degrees); and
$a_1 \neq 0$, $b_1 \neq 0$ and $c_1 \neq 0$;
correct a pre-measured correlation between the current of the secondary battery and the internal resistance of the secondary battery after the prescribed period based on the estimated internal resistance $\hat{K}(k)$; and
estimate the maximum possible current based on a corrected correlation between the current of the secondary battery and the internal resistance and on the upper limit voltage or lower limit voltage.

7. The device according to claim 1 wherein the maximum possible current estimating part is further operable to estimate a maximum possible charge current $\hat{I}_{MAX}$ when the terminal voltage reaches the upper limit voltage $V_{MAX}$ according to:

$$\hat{I}_{MAX} = \begin{cases} \dfrac{V_{MAX} - \hat{V}_0}{a}; & 0 \le \hat{I}_{MAX} \le e \\ \dfrac{-(a - d \cdot e) + \sqrt{(a - d \cdot e)^2 - 4d \cdot (\hat{V}_0 - V_{MAX})}}{2d}; & e < \hat{I}_{MAX} \end{cases};$$

and to estimate a maximum possible discharge current $\hat{I}_{MIN}$ when the terminal voltage reaches the lower limit voltage $V_{MIN}$ according to:

$$\hat{I}_{MIN} = \begin{cases} \dfrac{V_{MIN} - \hat{V}_0}{a}; & c \le \hat{I}_{MIN} \le 0 \\ \dfrac{-(a - b \cdot c) - \sqrt{(a - b \cdot c)^2 - 4b \cdot (\hat{V}_0 - V_{MIN})}}{2b}; & \hat{I}_{MIN} < c \end{cases};$$

wherein $\hat{V}_0$ is an estimated open-circuit voltage of the secondary battery; and a, b, c, d and e are real numbers based on a correlation between a current through the secondary battery and an internal resistance of the secondary battery over time such that c<e and a>0 and b≠0 and d≠0.

8. The device according to claim 1 wherein the maximum possible current estimating part is further operable to estimate a maximum possible charge current $\hat{I}_{MAX}$ when the terminal voltage reaches the upper limit voltage $V_{MAX}$ according to:

$$\hat{I}_{MAX} = \frac{V_{MAX} - \hat{V}_0}{\hat{K} + \dfrac{T_c}{g'(\hat{V}_0) \cdot Cap}};$$

and to estimate a maximum possible discharge current $\hat{I}_{MIN}$ when the terminal voltage reaches the lower limit voltage $V_{MIN}$ according to:

$$\hat{I}_{MIN} = \frac{V_{MIN} - \hat{V}_0}{\hat{K} + \dfrac{T_c}{g'(\hat{V}_0) \cdot Cap}}; \text{ wherein}$$

$\hat{V}_0$ is an estimated open-circuit voltage of the secondary battery;
Cap is a total capacitance of the secondary battery at time $T_c$;
$\hat{K}$ is an estimated internal resistance of the secondary battery at the time $T_c$; and
$g'(\hat{V}_0)$ is a derivative function of a polynomial formula representative of an open-circuit voltage—SOC characteristic such that $1/g'(\hat{V}_0)$ is a slope of the open-circuit voltage—SOC characteristic near estimated open-circuit voltage $\hat{V}_0$.

9. The device according to claim 1 wherein the maximum possible current estimating part is further operable to estimate a maximum possible charge current $\hat{I}_{MAX}$ when the terminal voltage reaches the upper limit voltage $V_{MAX}$ according to:

$$\hat{I}_{MAX} = \begin{cases} \dfrac{V_{MAX} - \hat{V}_0}{a + \dfrac{T_c}{g'(\hat{V}_0) \cdot Cap}}; & 0 \le \hat{I}_{MAX} \le e \\ \dfrac{-\left(a - d \cdot e + \dfrac{T_c}{g'(\hat{V}_0) \cdot Cap}\right) + \sqrt{\left(a - d \cdot e + \dfrac{T_c}{g'(\hat{V}_0) \cdot Cap}\right)^2 - 4d \cdot (\hat{V}_0 - V_{MAX})}}{2d}; & e < \hat{I}_{MAX} \end{cases}$$

and to estimate a maximum possible discharge current $\hat{I}_{MIN}$ when the terminal voltage reaches the lower limit voltage $V_{MIN}$ according to:

$$\hat{I}_{MIN} = \begin{cases} \dfrac{V_{MIN} - \hat{V}_0}{a + \dfrac{T_c}{g'(\hat{V}_0) \cdot Cap}}; & c \leq \hat{I}_{MIN} \leq 0 \\ \dfrac{-\left(a - b \cdot c + \dfrac{T_c}{g'(\hat{V}_0) \cdot Cap}\right) - \sqrt{\left(a - b \cdot c + \dfrac{T_c}{g'(\hat{V}_0) \cdot Cap}\right)^2 - 4b \cdot (\hat{V}_0 - V_{MIN})}}{2b}; & \hat{I}_{MIN} < c \end{cases}$$

wherein
$\hat{V}_0$ is an estimated open-circuit voltage of the secondary battery;
a, b, c, d and e are real numbers based on a correlation between a current through the secondary battery and an internal resistance of the secondary battery over time such that c<e and a>0 and b≠0 and d≠0;
Cap is a total capacitance of the secondary battery at time $T_c$;
$\hat{K}$ is an estimated internal resistance of the secondary battery at the time $T_c$; and
$g'(\hat{V}_0)$ is a derivative function of a polynomial formula representative of an open-circuit voltage—SOC characteristic such that $1/g'(\hat{V}_0)$ is a slope of the open-circuit voltage—SOC characteristic near estimated open-circuit voltage $\hat{V}_0$.

10. The device according to claim 1 wherein the power estimating part is further operable to multiply at least one of the upper limit voltage by a maximum possible charge current to calculate the inputtable power, and the lower limit voltage by a maximum possible discharge current to calculate the outputtable power.

11. The device according to claim 1 wherein the maximum possible current is a maximum possible charge current through the secondary battery when the terminal voltage of the secondary battery reaches the prescribed upper limit voltage when the secondary battery is charged continuously for the prescribed period of time; and wherein the maximum possible current estimating part is further operable to estimate a maximum possible discharge current through the secondary battery when the terminal voltage of the secondary battery reaches the lower limit voltage when the secondary battery is discharged continuously for the prescribed period of time; and wherein the power estimating part is further operable to estimate the inputtable power based on the maximum possible charge current and the upper limit voltage and to estimate the outputtable power based on the maximum possible discharge current and the lower limit voltage.

12. The device according to claim 1 wherein the power estimating part is further operable to multiply the upper limit voltage by the maximum possible charge current to calculate the inputtable power, and the lower limit voltage by the maximum possible discharge current to calculate the outputtable power.

13. A power estimating device that estimates at least one of a inputtable and a outputtable power of a secondary battery, comprising:
current estimating means for estimating at least one of a maximum possible charge current when a terminal voltage of the secondary battery reaches an upper limit voltage when the secondary battery is continuously charged for a first period of time, and a maximum possible discharge current when the terminal voltage of the secondary battery reaches a lower limit voltage when the secondary battery is continuously discharged for a second period of time; and
power estimating means for estimating at least one of the inputtable power based on the maximum possible charge current, and the upper limit voltage and the outputtable power based on the maximum possible discharge current and the lower limit voltage.

14. The device according to claim 13 wherein the current estimating means is further operable for estimating the one of the maximum possible charge current based on a correlation between a first current of the secondary battery after a prescribed charging period and an internal resistance of the secondary battery and the upper limit voltage, and the maximum possible discharge current based on a correlation between a second current of the secondary battery after a prescribed discharging period and the internal resistance and the lower limit voltage.

15. The device according to claim 13, further comprising:
means for estimating at least one of a first variation in an open-circuit voltage of the secondary battery that occurs during charging at a first prescribed current for a prescribed charge period, and a second variation in the open-circuit voltage that occurs during discharging at a second prescribed current for a prescribed discharge period; and wherein the current estimating means is further operable to estimate the one of the maximum possible charge current based on the first variation and the upper limit voltage, and the maximum possible discharge current based on the second variation and the lower limit voltage.

16. The device according to claim 13, further comprising:
means for estimating at least one of a first variation in an open-circuit voltage of the secondary battery that occurs during charging at a charging current for a prescribed charge period, and a second variation in the open-circuit voltage that occurs during discharging at a discharging current for a prescribed discharge period;
means for estimating at least one of a first correlation between a first current of the secondary battery after the prescribed charge period and the internal resistance, and a second correlation between a second current of the secondary battery after the prescribed discharge period and the internal resistance; and wherein the current estimating means is further operable to estimate the one of the maximum possible charge current based on the first correlation, the first variation and the upper limit voltage, and the maximum possible discharge current based on the second correlation, the second variation and the lower limit voltage.

17. A power estimating method for estimating a power of a secondary battery, the power representing at least one of a charge power and a discharge power of a secondary battery, the method comprising:
estimating a maximum possible current when a terminal voltage of the secondary battery reaches an upper limit voltage when the secondary battery is continuously charged for a first period of time, or a lower limit voltage when the secondary battery is continuously discharged for a second period of time, wherein the maximum possible current is one of a maximum possible charging current and a maximum possible discharging current; and
estimating the charge power based on the maximum possible charging current and the upper limit voltage, or the discharge power based on the maximum possible discharging current and the lower limit voltage.

18. The method according to claim 17, further comprising:
estimating a correlation between a current of the secondary battery after a prescribed period of charging or discharging and an internal resistance of the battery; and wherein estimating the maximum possible current further comprises:
estimating the maximum possible current based on the correlation and on the upper limit voltage when the correlation is based on the prescribed period of charging, or based on the correlation and the lower limit voltage when the correlation is based on the prescribed period of discharging.

19. The method according to claim 17, further comprising:
estimating a variation in an open-circuit voltage of the secondary battery that occurs during charging or discharging at a prescribed current for the respective first period of time or the second period of time; and wherein estimating the maximum possible current further comprises:
estimating the maximum possible current based on the variation and on the upper limit voltage when the variation is based on the first period of time, or based on the variation and the lower limit voltage when the variation is based on the second period of time.

20. The method according to claim 17, further comprising:
estimating a correlation between a current of the secondary battery after a prescribed period of charging or discharging and an internal resistance of the battery; and
estimating a variation in an open-circuit voltage of the secondary battery that occurs during charging or discharging at a prescribed current for the respective first period of time or the second period of time; and wherein estimating the maximum possible current further comprises:
estimating the maximum possible current based on the correlation and the variation and the upper limit voltage when the correlation is based on the prescribed period of charging and when the variation is based on the first period of time, or based on the correlation and the variation and the lower limit voltage when the correlation is based on the prescribed period of discharging and the variation is based on the second period of time.

* * * * *